(12) United States Patent
Cheng et al.

(10) Patent No.: US 10,859,885 B2
(45) Date of Patent: Dec. 8, 2020

(54) PIXEL STRUCTURE AND DRIVING METHOD CAPABLE OF SWITCHING DISPLAY MODE

(71) Applicant: Au Optronics Corporation, Hsinchu (TW)

(72) Inventors: Wei-Ming Cheng, Taipei (TW); Min-Hsuan Chiu, Taipei (TW); Syuan-Ling Yang, Kaohsiung (TW); Seok-Lyul Lee, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/835,248

(22) Filed: Mar. 30, 2020

(65) Prior Publication Data

US 2020/0225548 A1 Jul. 16, 2020

Related U.S. Application Data

(62) Division of application No. 16/008,062, filed on Jun. 14, 2018, now Pat. No. 10,690,981.

(30) Foreign Application Priority Data

Jan. 24, 2018 (TW) .............................. 107102545 A

(51) Int. Cl.
*G09G 3/36* (2006.01)
*G02F 1/1362* (2006.01)
(Continued)

(52) U.S. Cl.
CPC ...... *G02F 1/136286* (2013.01); *G02F 1/1368* (2013.01); *G02F 1/134309* (2013.01);
(Continued)

(58) Field of Classification Search
CPC ......... G02F 1/136286; G02F 1/134309; G02F 1/1368; G02F 1/136209; G02F 1/134363;
(Continued)

(56) References Cited

U.S. PATENT DOCUMENTS

2009/0310073 A1* 12/2009 Jeong ................. G02F 1/134363
349/139
2012/0211751 A1* 8/2012 Kim .................... H01L 27/1225
257/59

(Continued)

*Primary Examiner* — Lunyi Lai
*Assistant Examiner* — Jarurat Suteerawongsa
(74) *Attorney, Agent, or Firm* — JCIPRNET

(57) ABSTRACT

A pixel structure and a driving method are provided. The pixel structure includes a scan line, a first data line, a second data line, a first switching element, a second switching element, a common electrode, a first electrode and a second electrode. The first switching element is electrically connected with the scan line, the first data line and the first electrode. The second switching element is electrically connected with the second data line and the second electrode. The common electrode includes two first body portions and at least two first branch portions. The first electrode includes a second body portion and at least two second branch portions. The second electrode includes at least two main portions and at least one bridge portion. The at least one bridge portion overlaps at least one of the first branch portions in a projection direction.

8 Claims, 12 Drawing Sheets

(51) Int. Cl.
  *H01L 27/12* (2006.01)
  *G02F 1/1368* (2006.01)
  *G02F 1/1343* (2006.01)

(52) U.S. Cl.
  CPC ......... *G09G 3/3655* (2013.01); *H01L 27/124* (2013.01); *G02F 1/136209* (2013.01); *G09G 2300/0426* (2013.01); *G09G 2300/0439* (2013.01); *G09G 2320/0252* (2013.01); *G09G 2330/021* (2013.01)

(58) Field of Classification Search
  CPC ......... G09G 3/3655; G09G 2320/0252; G09G 2300/0426; G09G 2300/0439; G09G 2330/021; G09G 3/36; H01L 27/124
  See application file for complete search history.

(56) References Cited

U.S. PATENT DOCUMENTS

2017/0039975 A1* 2/2017 Ito ..................... G02F 1/133528
2018/0088366 A1* 3/2018 Xu ........................ G02F 1/1323

* cited by examiner

PIXEL STRUCTURE AND DRIVING METHOD CAPABLE OF SWITCHING DISPLAY MODE

This application is a divisional application of and claims the priority benefit of U.S. application Ser. No. 16/008,062, filed on Jun. 14, 2018, now allowed, which claims the priority benefit of Taiwan application serial no. 107102545, filed on Jan. 24, 2018. The entirety of each of the above-mentioned patent applications is hereby incorporated by reference herein and made a part of this specification.

BACKGROUND OF THE INVENTION

Field of the Invention

The invention relates to a pixel structure, and particularly relates to a pixel structure having a common electrode, a first electrode and a second electrode, and a driving method capable of switching display modes.

Description of Related Art

With advances in technology, demands for performance of display apparatuses have been gradually increasing, especially virtual reality (VR) display apparatuses, augmented reality (AR) display apparatuses and so on. How to shorten liquid crystal response time is particularly important in order to avoid image delay.

However, while shortening liquid crystal response time, a light transmittance of a pixel structure in a display apparatus is often sacrificed. In order for the display apparatus to display a screen with sufficient brightness, more power is required to be provided to the backlight module of the display apparatus. Therefore, there is a need to solve the aforementioned problem.

SUMMARY OF THE INVENTION

The invention provides a pixel structure, adapted to perform an operation mode for shortening liquid crystal response time and an operation mode for high transmittance. Therefore, the operation mode for high transmittance may be performed under the situation when fast liquid crystal response time is not required so as to save power consumption.

The invention provides a driving method capable of switching display modes including a fast mode for short response time of liquid crystal and a general mode for high transmittance. Therefore, the general mode for high transmittance may be performed under the situation when fast liquid crystal response time is not required so as to save power consumption.

At least one embodiment of the invention provides a pixel structure. The pixel structure includes a scan line, a first data line, a second data line, a first switching element, a second switching element, a common electrode, a first electrode and a second electrode. The first data line and the second data line extend substantially in a first direction. The first switching element is electrically connected to the scan line and the first data line. The second switching element and the second data line are electrically connected. The common electrode includes first body portions and first branch portions. The first body portions extend substantially in the first direction. The first branch portions are respectively connected to the corresponding first body portions. The first electrode is electrically connected to the first switching element. The first electrode includes a second body portion and second branch portions. The second body portion is located between the first body portions and extends substantially in the first direction. At least two second branch portions are correspondingly electrically connected to two sides of the second body portion and extend outwards. The second electrode is electrically connected to the second switching element. The second electrode includes main portions and at least one bridge portion. The main portions extend substantially in the first direction. The at least one bridge portion is electrically connected to the main portions and overlaps at least one of the first branch portions in a projection direction. The at least one bridge portion does not overlap at least one of the second branch portions in the projection direction.

At least one embodiment of the invention provides a pixel structure. The pixel structure includes a scan line, a first data line, a second data line, a first switching element, a second switching element, a common electrode, a first electrode and a second electrode. The first data line and the second data line extend substantially in a first direction. The first switching element is electrically connected to the scan line and the first data line. The second switching element and the second data line are electrically connected. The common electrode includes a first body portion and first branch portions. The first body portion extends substantially in the first direction. The first branch portions are connected to the first body portions. The first electrode is electrically connected to the first switching element. The first electrode includes a second body portion and second branch portions. The second branch portions are connected to the second body portions. The first branch portions and the second branch portions are substantially located between the first body portion and the second body portion, and the first branch portions and the second branch portions are alternately arranged in the first direction. The second electrode is electrically connected to the second switching element. The second electrode includes main portions and at least one bridge portion. The main portions extend substantially in the first direction. The at least one bridge portion is connected to the main portions. The at least one bridge portion and at least one of the first branch portions overlap in a projection direction.

At least one embodiment of the invention provides a driving method capable of switching display modes, including: providing a display device including at least one pixel structure as described above; performing a fast mode, including applying a first voltage to the at least one first electrode, and not applying the first voltage to the at least one second electrode and a common electrode; and performing a general mode, including applying a second voltage to the at least one second electrode, and not applying the second voltage to the at least one first electrode and the common electrode.

One of the objectives of the invention is to provide a pixel structure capable of shortening liquid crystal response time of a liquid crystal display panel.

One of the objectives of the invention is to provide a pixel structure capable of increasing a light transmittance of a liquid crystal display panel.

One of the objectives of the invention is to provide a driving method capable of switching display modes including a fast mode for short liquid crystal response time and a general mode for high light transmittance. Therefore, the general mode for high transmittance may be performed under the situation when fast liquid crystal response time is not required so as to save power consumption.

To make the above features and advantages of the invention more comprehensible, embodiments accompanied with drawings are described in detail as follows.

DETAILED DESCRIPTION OF DISCLOSED EMBODIMENTS

The invention will have a more comprehensive description hereinafter with reference to the accompanying drawings, in which embodiments of the invention are shown. As those skilled in the art would realize, the described embodiments may be modified in various different ways, without departing from the spirit or scope of the invention.

The use of "electrically connected" in the text may mean that at least two elements directly contact or indirectly electrically contact with each other. The manner of being indirectly electrically contact with each other is exemplified as the elements are in physical contact or electrical contact with each other via an intermediate element. The aforementioned intermediate element may be a switch (for example, a thin film transistor) or an element such as a resistor or a capacitor. The use of "electrically connected" may also represent that at least two elements operate or act on each other.

Figure 1A:
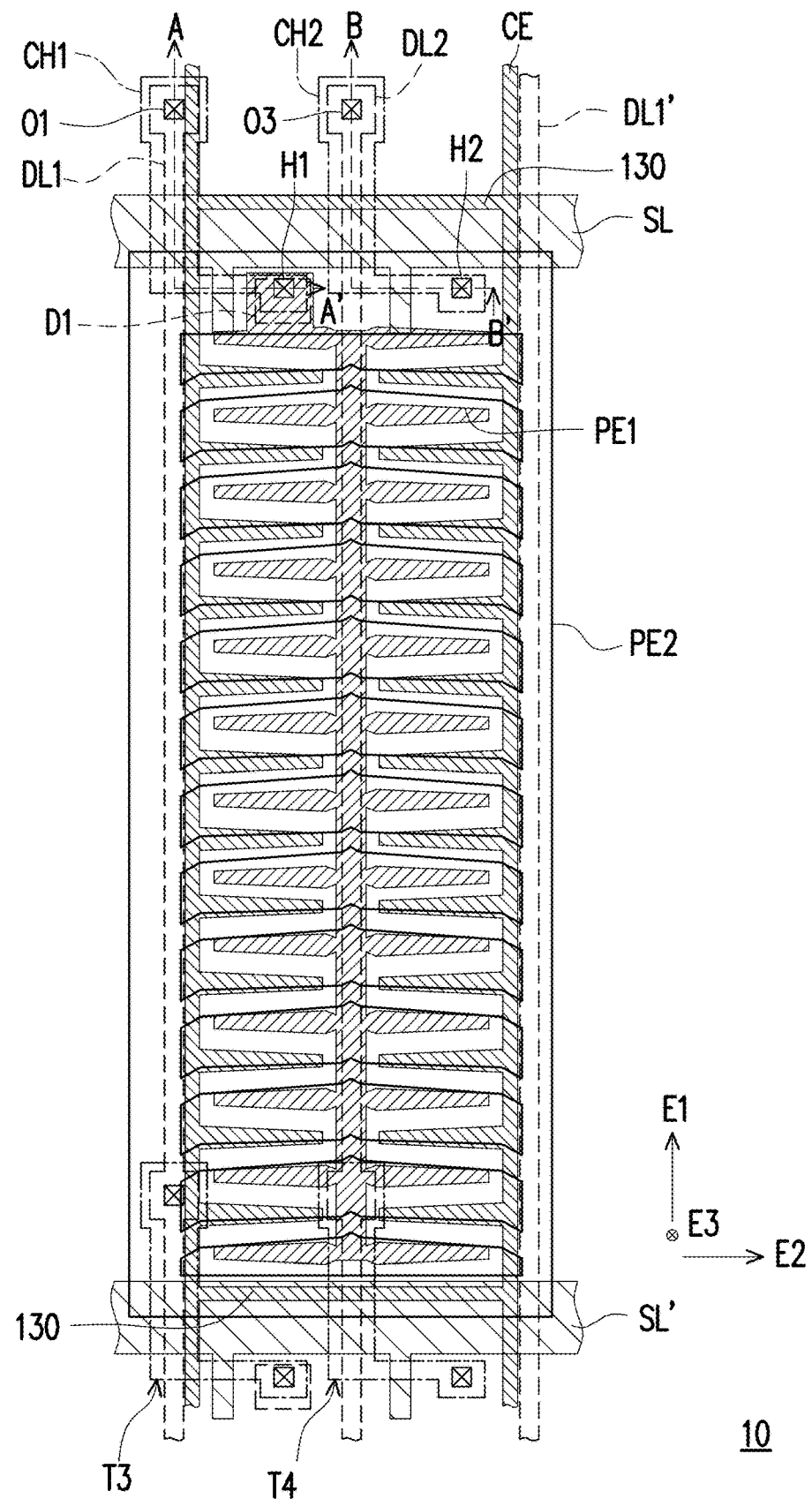
FIG. 1A is a schematic top view of a pixel structure and surrounding elements thereof according to an embodiment of the invention.
Figure 1B:
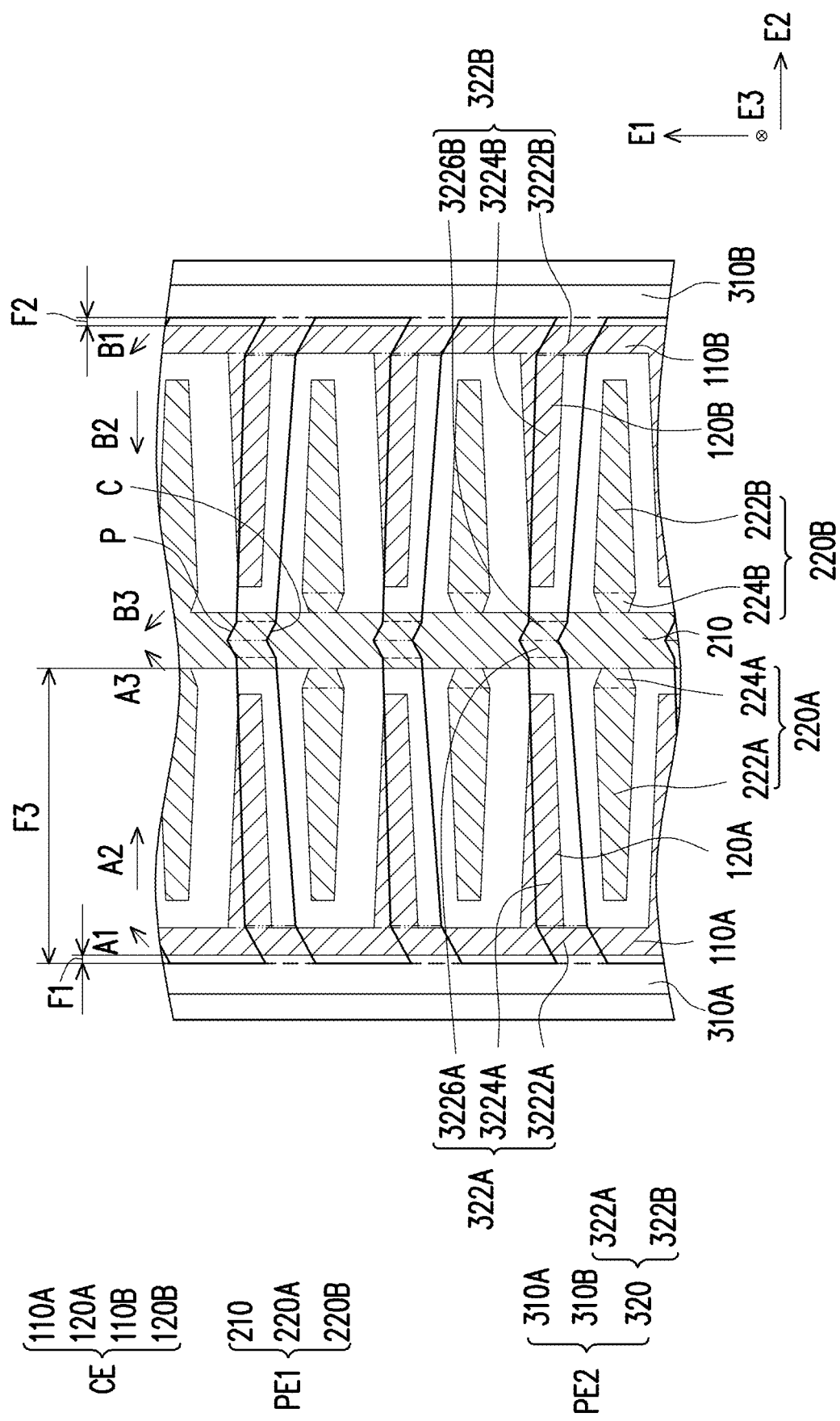
FIG. 1B is a partially enlarged view of FIG. 1A.
Figure 2A:
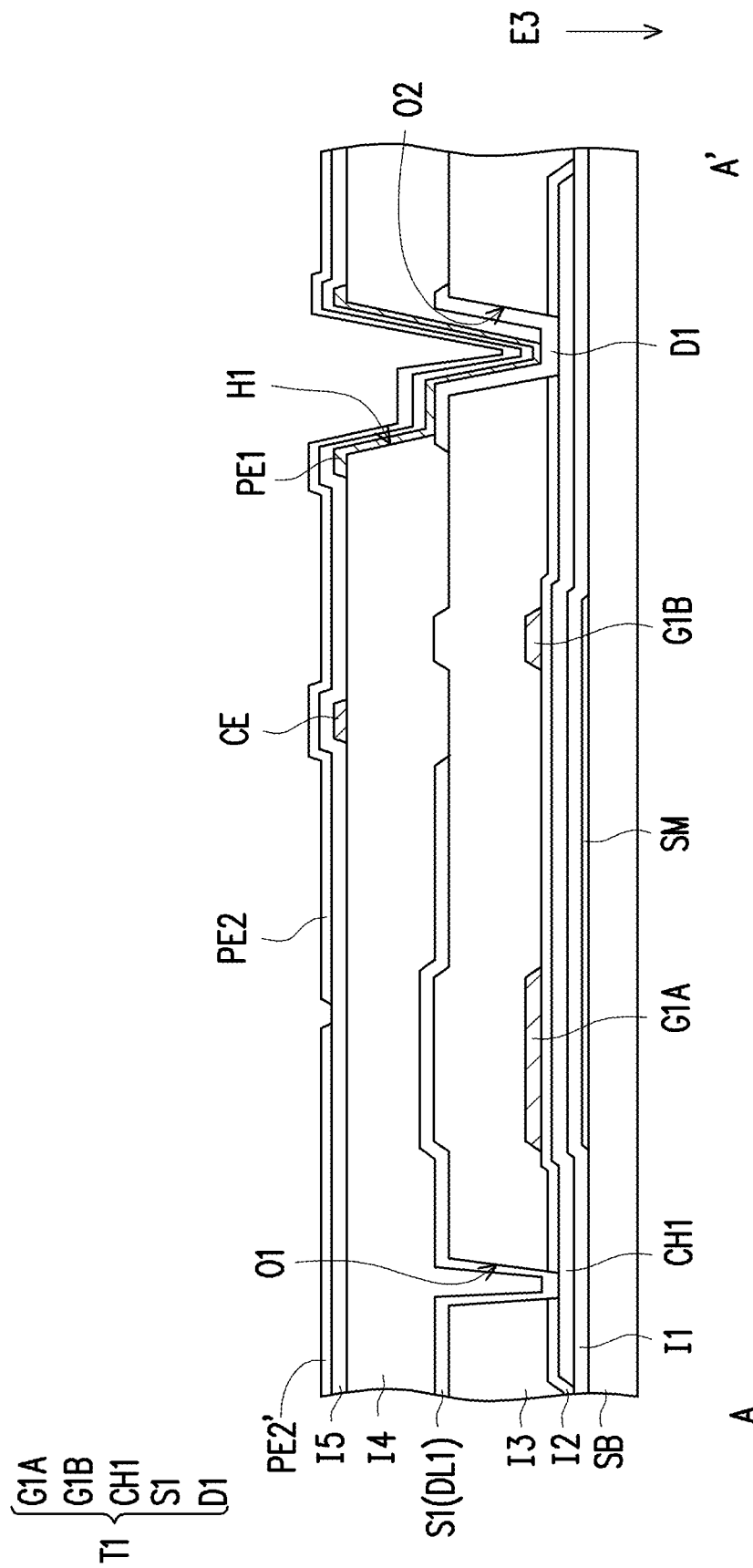
FIG. 2A is a cross-sectional view taken along line AA' in FIG. 1A.
Figure 2B:
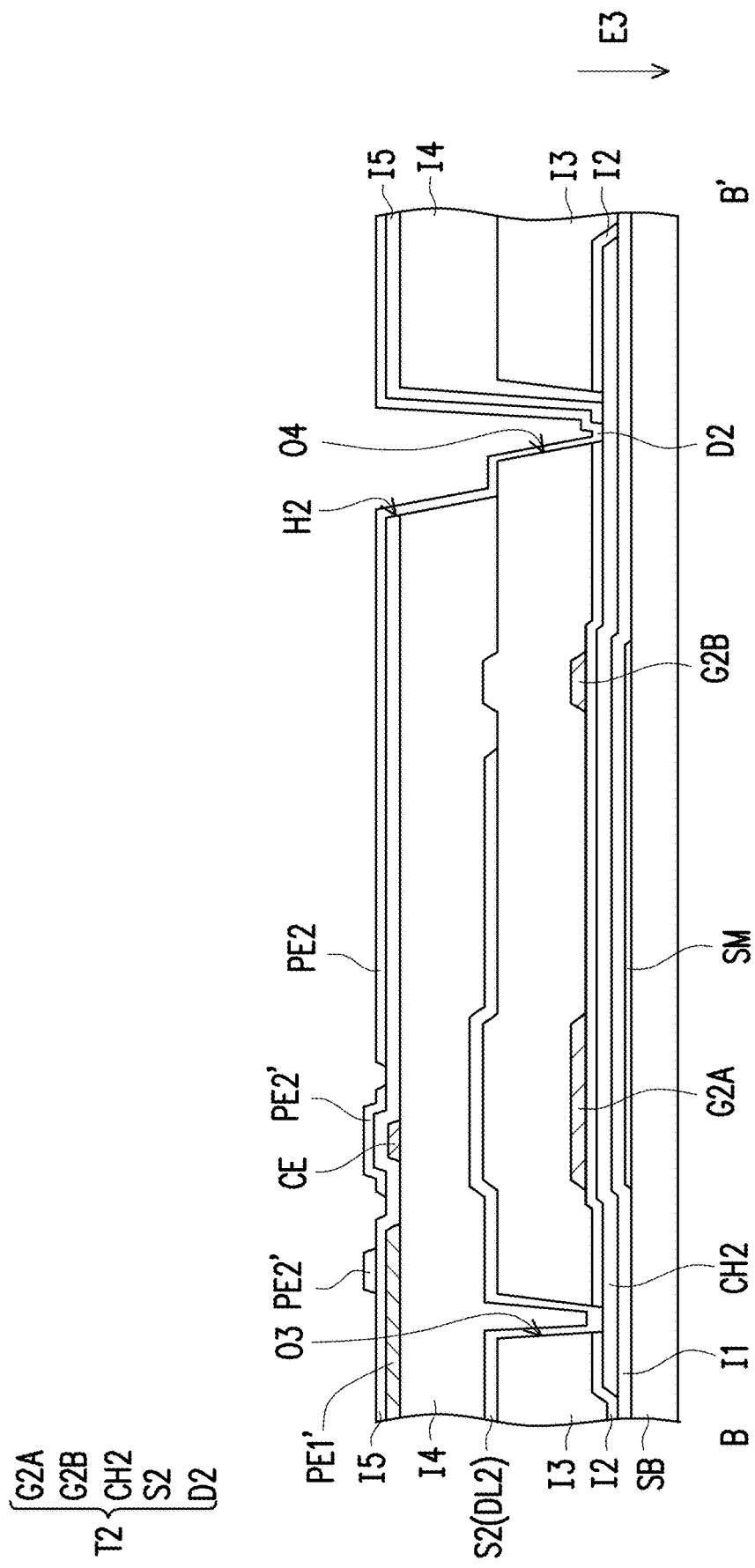
FIG. 2B is a cross-sectional view taken along line BB' in FIG. 1A.

FIG. 1A is a schematic top view of a pixel structure and surrounding elements thereof according to an embodiment of the invention. FIG. 1B is a partially enlarged view of FIG. 1A. For convenience of description, FIG. 1B illustrates a common electrode, a first electrode, and a second electrode, and omits other components. FIG. 2A is a cross-sectional view taken along line AA' in FIG. 1A. FIG. 2B is a cross-sectional view taken along line BB' in FIG. 1A, wherein FIG. 1A omits some components in FIG. 2A and FIG. 2B.

Referring to FIG. 1A, FIG. 2A and FIG. 2B, a pixel structure 10 includes a scan line SL, a first data line DL1, a second data line DL2, a first switching element T1, a second switching element T2, a common electrode CE, a first electrode PE1, and a second electrode PE2.

The first switching element T1 is electrically connected to the scan line SL and the first data line DL1. The second switching element T2 and the second data line DL2 are electrically connected. The second switching element T2 and the scan line SL are electrically connected, but the invention is not limited thereto. In other embodiments, the second switching element T2 may be electrically connected to another scan line. The first switching element T3 is electrically connected to scan line SL' and the first data line DL1. The second switching element T4 is electrically connected to the second data line DL2. The second switching element T4 is electrically connected to the scan line SL', but the invention is not limited thereto. In other embodiments, the second switching element T4 may be electrically connected to another scan line. The first switching element T3 and the second switching element T4 are, for example, switching elements belonging to other pixel structures adjacent to the pixel structure 10.

The first data line DL1, the second data line DL2, and the first data line DL1' extend substantially along first direction E1. The scan line SL and the scan line SL' extend substantially in second direction E2, but the invention is not limited thereto. The second direction E2 is substantially perpendicular to the first direction E1, but the invention is not limited thereto.

In the embodiment, although the scan line SL, the scan line SL', the first data line DL1, the first data line DL1' and the second data line DL2 are, for example, linear, the present invention is not limited thereto. In other embodiments, the scan line SL, the scan line SL', the first data line DL1, the first data line DL1', and the second data line DL2 may be zigzag or other shapes. The second data line DL2 is located between the first data line DL1 and the first data line DL1', wherein the first data line DL1' is, for example, a data line belonging to another pixel structure adjacent to the pixel structure 10. In some embodiments, a black matrix (not shown) covers the scan line SL, the first data line DL1 and the second data line DL2, but the invention is not limited thereto.

Referring to FIG. 1A, FIG. 2A and FIG. 2B together, the scan line SL, the first data line DL1, the second data line DL2, the first switching element T1, the second switching element T2, the common electrode CE, the first electrode PE1, the second electrode PE2, the first electrode PE1' and the second electrode PE2' are located on substrate SB, wherein the first electrode PE1' (not shown in FIG. 1A) and the second electrode PE2' (not shown in FIG. 1A) are, for example, electrodes belonging to another pixel structure adjacent to the pixel structure 10.

In the present embodiment, the first switching element T1 includes, for example, first gate G1A, second gate G1B, channel layer CH1, source S1 and drain D1, wherein the first gate G1A and the second gate G1B are electrically connected to the scan line SL, and the source S1 is electrically connected to the first data line DL1. First insulating layer I1 and light shading layer SM are selectively disposed between the channel layer CH1 and the substrate SB, wherein the light shading layer SM may improve current leakage of the first switching element T1. The channel layer CH1 overlaps the first gate G1A and the second gate G1B. Second insulating layer I2 is interposed between the channel layer CH1 and the first gate G1A and between the channel layer CH1 and the second gate G1B. Third insulating layer I3 is formed on the second insulating layer I2, the first gate G1A and the second gate G1B. The source S1 and the drain D1 are formed on the third insulating layer I3, and are respectively electrically connected to the channel layer CH1 by opening O1 and opening O2. The opening O1, for example, penetrates the second insulating layer I2 and the third insulating layer I3. The opening O2, for example, penetrates the second insulating layer I2 and the third insulating layer I3.

Fourth insulating layer I4 is formed on the third insulating layer I3, the source S1 and the drain D1. In the present embodiment, the common electrode CE and the first electrode PE1 are formed on the fourth insulating layer I4. The first electrode PE1 is electrically connected to the drain D1 of the first switching element T1. In the present embodiment, the first electrode PE1 is electrically connected to the drain D1 through opening H1 of the fourth insulating layer I4. The opening H1, for example, overlaps the opening O2, but the invention is not limited thereto.

The second switching element T2 includes, for example, first gate G2A, second gate G2B, channel layer CH2, source S2 and drain D2, wherein the first gate G2A and the second gate G2B are electrically connected to the scan line SL, and the source S2 is electrically connected to the second data line DL2. In the present embodiment, although the first switching element T1 and the second switching element T2 are both electrically connected to the same scan line SL, the invention is not limited thereto. In other embodiments, the first switching element T1 and the second switching element T2 may be electrically connected to different scan lines.

The first insulating layer I1 and the light shading layer SM are selectively disposed between the channel layer CH2 and the substrate SB, wherein the light shading layer SM may improve the current leakage of the second switching element T2. The channel layer CH2 overlaps the first gate G2A and the second gate G2B. The second insulating layer I2 is interposed between the channel layer CH2 and the first gate G2A and between the channel layer CH2 and the second gate G2B. The third insulating layer I3 is formed on the second insulating layer I2, the first gate G2A and the second gate G2B. The source S2 and the drain D2 are formed on the third insulating layer I3, and are respectively electrically connected to the channel layer CH2 by opening O3 and opening O4. The opening O3, for example, penetrates the second insulating layer I2 and the third insulating layer I3. The opening O4, for example, penetrates the second insulating layer I2 and the third insulating layer I3.

The fourth insulating layer I4 is formed on the third insulating layer I3, the source S2 and the drain D2. The second electrode PE2 is electrically connected to the drain D2 of the second switching element T2. In the present embodiment, the drain D2 and the second electrode PE2 may be integrally formed by a single layer and directly connected, but the invention is not limited thereto. The common electrode CE and the first electrode PE1 are formed on the fourth insulating layer I4. A fifth insulating layer I5 is formed on the first electrode PE1, the common electrode CE and the fourth insulation layer I4. The second electrode PE2 is formed on the fifth insulating layer I5. The second electrode PE2, the first electrode PE1, and the common electrode CE are separated from each other. In the present embodiment, opening H2 penetrates the fourth insulating layer I4 and the fifth insulating layer I5. The second electrode PE2 is electrically connected to the second switching element T2 through the opening H2. The opening H2, for example, overlaps the opening O4, but the invention is not limited thereto. In other embodiments, the drain D2 and the second electrode PE2 may be respectively formed by different conductive layers. The opening H2 and the opening O4 may not overlap.

In the present embodiment, the channel layer CH1 and the channel layer CH2 are, for example, L-shaped, but the invention is not limited thereto. In other embodiments, the channel layer CH1 and the channel layer CH2 may be U-shaped or other shapes.

In the present embodiment, the first switching element T1 and the second switching element T2 are, for example, top gate type thin film transistors, but the invention is not limited thereto. The first switching element T1 and the second switching element T2 may be bottom gate type thin film transistors or other types of switching elements. In the present embodiment, each of the first switching element T1 and the second switching element T2 includes two gates, but the invention is not limited thereto. In other embodiments, each of the first switching element T1 and the second switching element T2 includes only one gate.

The common electrode CE is formed on the fourth insulating layer I4. The common electrode CE includes at least two of the first body portions and at least two of the first branch portions. Referring to FIG. 1B, first body portions 110A and 110B extend substantially in the first direction E1. First branch portions 120A and 120B are located between the first body portions 110A and 110B. The first branch portions 120A and 120B are respectively connected to the corresponding first body portions 110A and 110B. The first branch portion 120A, for example, extends in a direction from the first body portion 110A towards the first body portion 110B. The first branch portion 120B, for example, extends in a direction from the first body portion 110B towards the first body portion 110A. In some exemplary embodiments, a width of the first branch portion 120A gradually decreases along a direction away from the first body portion 110A, and a width of the first branch portion 120B gradually decreases along a direction away from the first body portion 110B. In some exemplary embodiments, a shape of each of the first branch portions 120A and 120B includes, for example, a trapezoid, a triangle, or other geometric shapes. Referring to FIG. 1A and FIG. 1B together, the first body portion 110A and the first body portion 110B are electrically connected at least by intermediary portion 130. The intermediary portion 130 is, for example, directly connected between the first body portion 110A and the first body portion 110B. A length of the intermediary portion 130 is greater than a length of the first branch portion 120A and a length of the first branch portion 120B. The intermediary portion 130, for example, overlaps the scan line SL or the scan line SL'. The intermediary portion 130 is, for example, parallel to the scan lines SL or SL', but the invention is not limited thereto.

The first electrode PE1 is formed on the fourth insulating layer I4. The first electrode PE1 is separate from the common electrode CE. The first electrode PE1 includes a second body portion and at least two second branch portions. Referring to FIG. 1B, second body portion 210 is located between the first body portion 110A and the first body portion 110B, and extends substantially in the first direction E1. The second branch portions 220A and 220B are correspondingly electrically connected to two opposite sides of the second body portion 210 and extend outwards. The second branch portions 220A and 220B, for example, respectively extend towards the first body portions 110A and 110B. The second branch portions 220A and 220B are, for example, aligned with respect to the second body portion 210. The adjacent second branch portion 220A and second branch portion 220B are, for example, mirror-symmetrical to each other with respect to the second body portion 210. Referring to FIG. 1A and FIG. 1B together, the second body portion 210, for example, overlaps the second data line DL2 in a projection direction E3. A width of the second body portion 210 is, for example, greater than a width of the second data line DL2, but the invention is not limited thereto. The projection direction E3, for example, is perpendicular to the substrate SB.

The second branch portion 220A includes extending portion 222A and trapezoid structure 224A. The extending portion 222A extends substantially in a second direction E2. A width of the extending portion 222A, for example, gradually decreases along a direction away from the second body portion 210. The trapezoid structure 224A is connected between the second body portion 210 and the extending portion 222A. A width of the trapezoid structure 224A, for example, gradually increases along a direction away from the second body portion 210. The second branch portion 220B includes extending portion 222B and trapezoid structure 224B. The extending portion 222B extends substantially in the second direction E2. A width of the extending portion 222B, for example, gradually decreases along a direction away from the second body portion 210. The trapezoid structure 224B is connected between the second body portion 210 and the extending portion 222B. A width of the trapezoid structure 224B, for example, gradually increases in a direction away from the second body portion 210.

When the first electrode PE1 of the pixel structure 10 is used to drive a liquid crystal located thereon, since the trapezoid structure 224A and the trapezoid structure 224B are respectively connected between the second body portion 210 and the extending portion 222A and between the second body portion 210 and the extending portion 222B, an electric field may be more concentrated at a location near the second body portion 210, such that the portion with poor liquid crystal efficiency of the liquid crystal layer (not shown) can be restricted at the location near the second body portion 210. In addition, since the second body portion 210 overlaps the second data line DL2, the second data line DL2 may further shield most of the aforementioned portion with poor liquid crystal efficiency, thereby increasing the liquid crystal efficiency of the entire liquid crystal display panel.

In the present embodiment, the common electrode CE and the first electrode PE1 are, for example, formed by a same patterned conductive layer. In other words, the common electrode CE and the first electrode PE1 are formed in the same patterning process, but the invention is not limited thereto.

The second electrode PE2 includes at least two main portions and at least one bridge portion. Main portions 310A and 310B extend substantially in the first direction E1. In some embodiments, the first body portions 110A and 110B respectively overlap the main portions 310A and 310B. The first body portion 110A and its adjacent main portion 310A may be separated by distance F1. The first body portion 110B and its adjacent main portion 310B may be separated by distance F2. Each of the distance F1 and the distance F2 is from 0 microns to 5 microns. In some embodiments, the second body portion 210 is separated from its adjacent main portion 310A (or main portion 310B) by distance F3, and the distance F3 is from 10 microns to 30 microns.

Referring to FIG. 1A and FIG. 1B together, each of the main portions 310A and 310B overlaps the first data line DL1 or the second data line DL2 in the projection direction E3. In the present embodiment, the first data line DL1 and the first data line DL1' respectively overlap the main portion 310A and the main portion 310B in the projection direction E3, but the invention is not limited thereto. In other embodiments, the first data line DL1 and the first data line DL1' respectively overlap the first body portion 110A and the first body portion 110B in the projection direction E3. In some embodiments, the main portion 310A and the main portion 310B respectively partially overlap the first body portion 110A and the first body portion 110B in the projection direction E3.

The bridge portion 320 is located between the main portions 310A and 310B, and electrically connects the main portions 310A and 310B. The bridge portion 320 overlaps at least one of the first branch portions 120A and 120B in the projection direction E3. In the present embodiment, the bridge portion 320 partially overlaps the first branch portions 120A and 120B in the projection direction E3. In other words, the bridge portion 320 does not completely overlap the first branch portions 120A and 120B in the projection direction E3, and the bridge portion 320 exposes a portion of the first branch portion 120A and a portion of the first branch portion 120B in the projection direction E3. The bridge portion 320 does not overlap at least one of the second branch portions 220A and 220B in the projection direction E3. In the present embodiment, the bridge portion 320 does not overlap the second branch portions 220A and 220B in the projection direction E3.

The bridge portion 320 includes two main connecting portions 322A and 322B that are electrically connected to each other. The main connecting portion 322A includes first connecting portion 3222A, second connecting portion 3224A, and third connecting portion 3226A that are sequentially connected. The main connecting portion 322B includes first connecting portion 3222B, second connecting portion 3224B, and third connecting portion 3226B that are sequentially connected. The first connecting portions 3222A and 3222B are respectively connected to the corresponding main portions 310A and 310B. A width of the second connecting portion 3224A, for example, gradually decreases along a direction approaching the third connecting portion 3226A, and a width of the second connecting portion 3224B, for example, gradually decreases along a direction approaching the third connecting portion 3226B. For example, the angle formed between the sidewall of any one of the second connecting portions 3224A and 3224B close to the scan line SL and the second direction E2 is about 2 degrees. The angle formed between the sidewall of any one of the second connecting portions 3224A and 3224B away from the scan line SL and the second direction E2 is about 4 degrees, but the invention is not limited thereto.

The third connecting portions 3226A and 3226B of the main connecting portions 322A and 322B are overlapped the second body portion 210 in the projection direction E3, and are connected to each other to form convex portion P and concave portion C disposed opposite to each other.

The extending direction A1 of the first connecting portion 3222A is, for example, different from the extending direction A2 of the second connecting portion 3224A. The extending direction A2 of the second connecting portion 3224A is, for example, different from the extending direction A3 of the third connecting portion 3226A. The extending direction B1 of the first connecting portion 3222B is, for example, different from the extending direction B2 of the second connecting portion 3224B. The extending direction B2 of the second connecting portion 3224B is, for example, different from the extending direction B3 of the third connecting portion 3226B. When using the second electrode PE2 of the pixel structure 10 to drive a liquid crystal located thereon, since the extending directions A1 and A3 of the first connecting portion 3222A and the third connecting portion 3226A are different from the extending direction A2 of the second connecting portion 3224A, and the extending directions B1 and B3 of the first connecting portion 3222B and the third connecting portion 3226B are different from the extending direction B2 of the second connecting portion 3224B, an electric field may be more concentrated at a location near the first body portions 110A, 110B and/or the second body portion 210, such that the portion with poor liquid crystal efficiency of the liquid crystal layer (not shown) can be restricted at the location near the first body portions 110A, 110B and/or the second body portion 210. In addition, the second data line DL2 or a black matrix (not shown) may be used to further shield most of the aforementioned portion with poor liquid crystal efficiency, thereby increasing the liquid crystal efficiency of the entire liquid crystal display panel.

In general, if rise time and decay time of a liquid crystal are shorter, the liquid crystal response time is shorter. [Formula 1] is an equation for a liquid crystal rise time ($\tau_{rise}$) and [Equation 2] is an equation for a liquid crystal decay time ($\tau_{decay}$).

$$\tau_{rise} = \frac{\gamma_1}{\left[\frac{\Delta \varepsilon E^2}{4\pi} - \frac{K_1 \pi^2}{d^2} - \frac{K_2 \pi^2}{l^2}\right]} \quad \text{[Formula 1]}$$

$$\tau_{decay} = \frac{\gamma_1}{\left[\frac{K_1 \pi^2}{d^2} + \frac{K_2 \pi^2}{l^2}\right]} \quad \text{[Formula 2]}$$

In [Formula 1] and [Formula 2], $\gamma_1$ represents a rotational viscosity, E represents an electric field strength, d represents a thickness of a liquid crystal layer, $K_1$ and $K_2$ are elastic constants of the liquid crystal, and $\Delta \varepsilon$ represents a dielectric constant difference of the liquid crystal. 1 is a vertical distance between two dark areas when an external electric field is applied to the liquid crystal layer, and l represents a domain size of the pixel structure. When the domain size l of the pixel structure is smaller, the liquid crystal response time is shorter.

In the present embodiment, when first voltage is applied to the first electrode PE1 and the first voltage is not applied to the second electrode PE2 and the common electrode CE, the domain size of the pixel structure 10 may be regarded as L1. When second voltage is applied to the second electrode PE2 and the second voltage is not applied to the first electrode PE1 and the common electrode CE, the domain size of the pixel structure 10 may be regarded as L2. Since the bridge portion 320 partially overlaps the first branch portions 120A and 120B in the projection direction E3 to create the aforementioned effect, L1 is smaller than L2.

In other words, when the first voltage is applied to the first electrode PE1 and the first voltage is not applied to the second electrode PE2 and the common electrode CE, due to the smaller domain size L1, the pixel structure 10 has an advantage of shortening the liquid crystal response time of the liquid crystal display panel. When the second voltage is applied to the second electrode PE2 and the second voltage is not applied to the first electrode PE1 and the common electrode CE, the domain size L2 is larger, and the liquid crystal layer may have a higher light transmittance. Therefore, when fast liquid crystal response time is not required, the pixel structure 10 may be operated in a mode for higher light transmittance, so as to save power consumption.

Figure 3A:
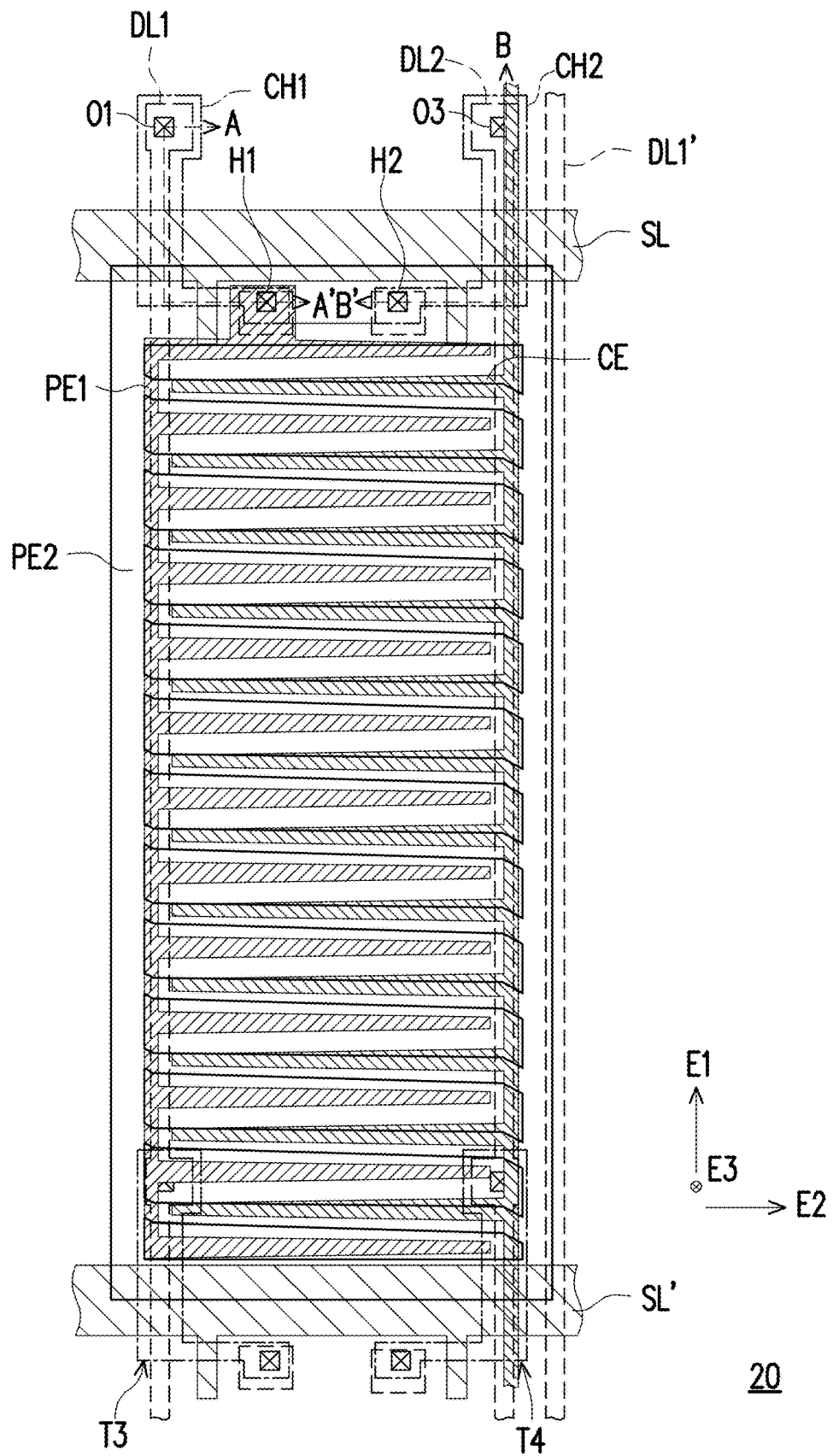
FIG. 3A is a schematic top view of a pixel structure and surrounding elements thereof according to an embodiment of the invention.
Figure 3B:
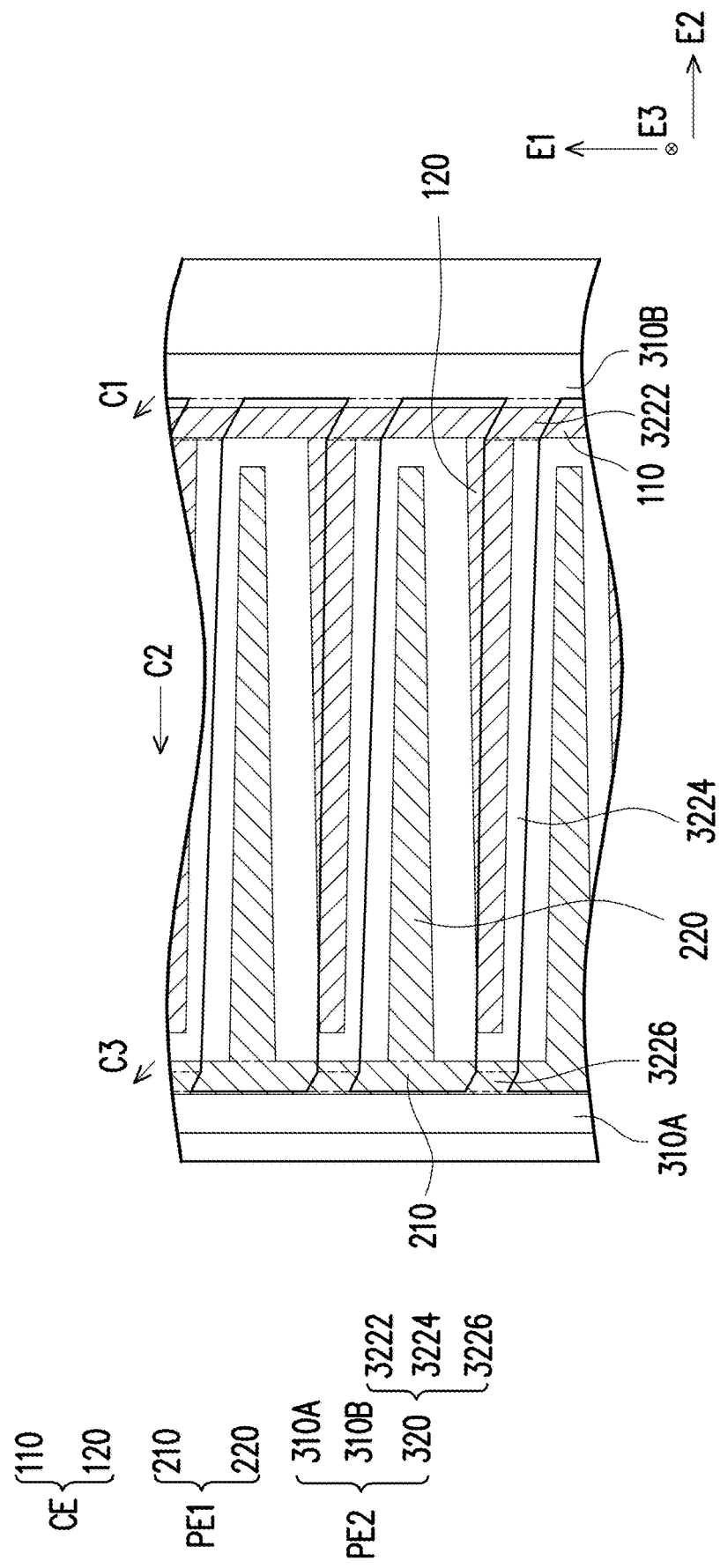
FIG. 3B is a partially enlarged view of FIG. 3A.
Figure 4A:
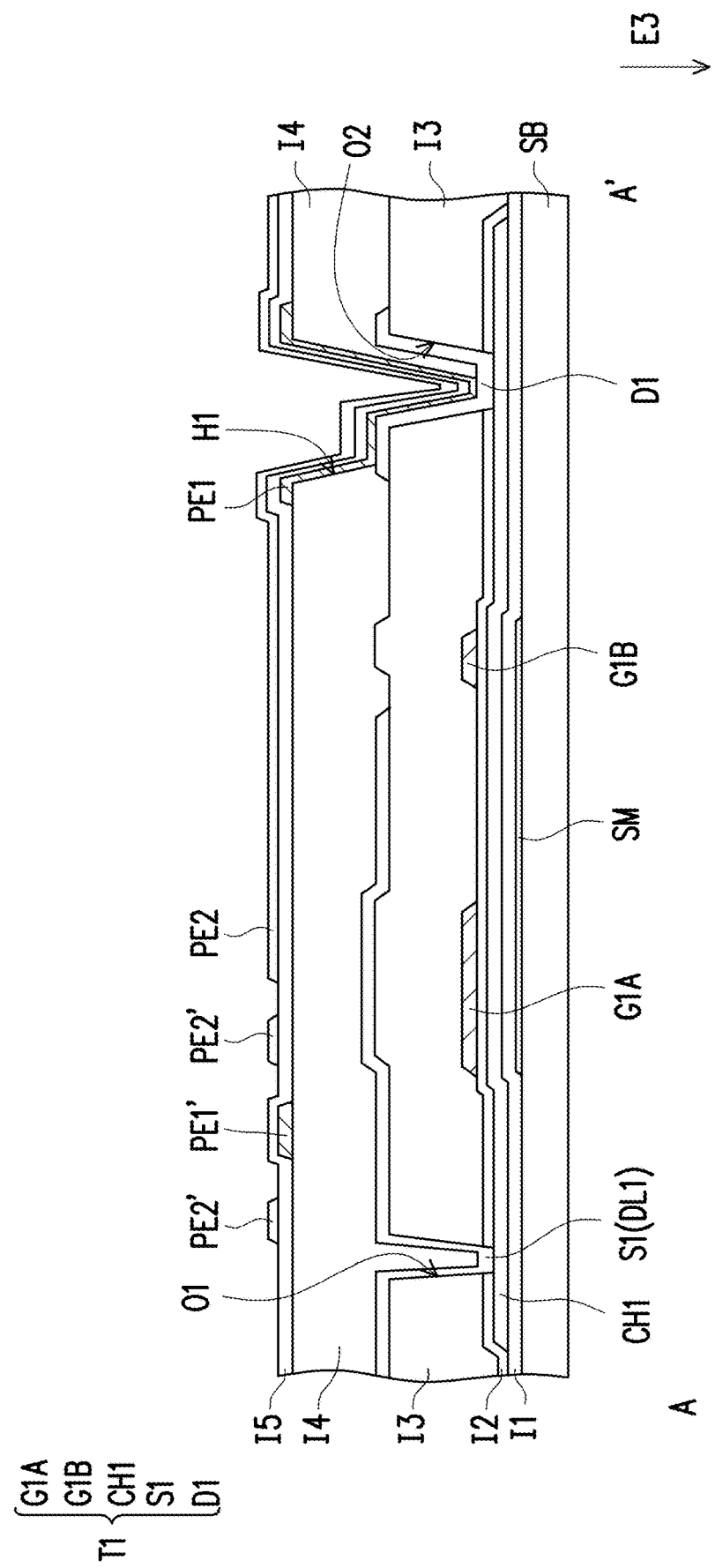
FIG. 4A is a cross-sectional view taken along line AA' in FIG. 3A.
Figure 4B:
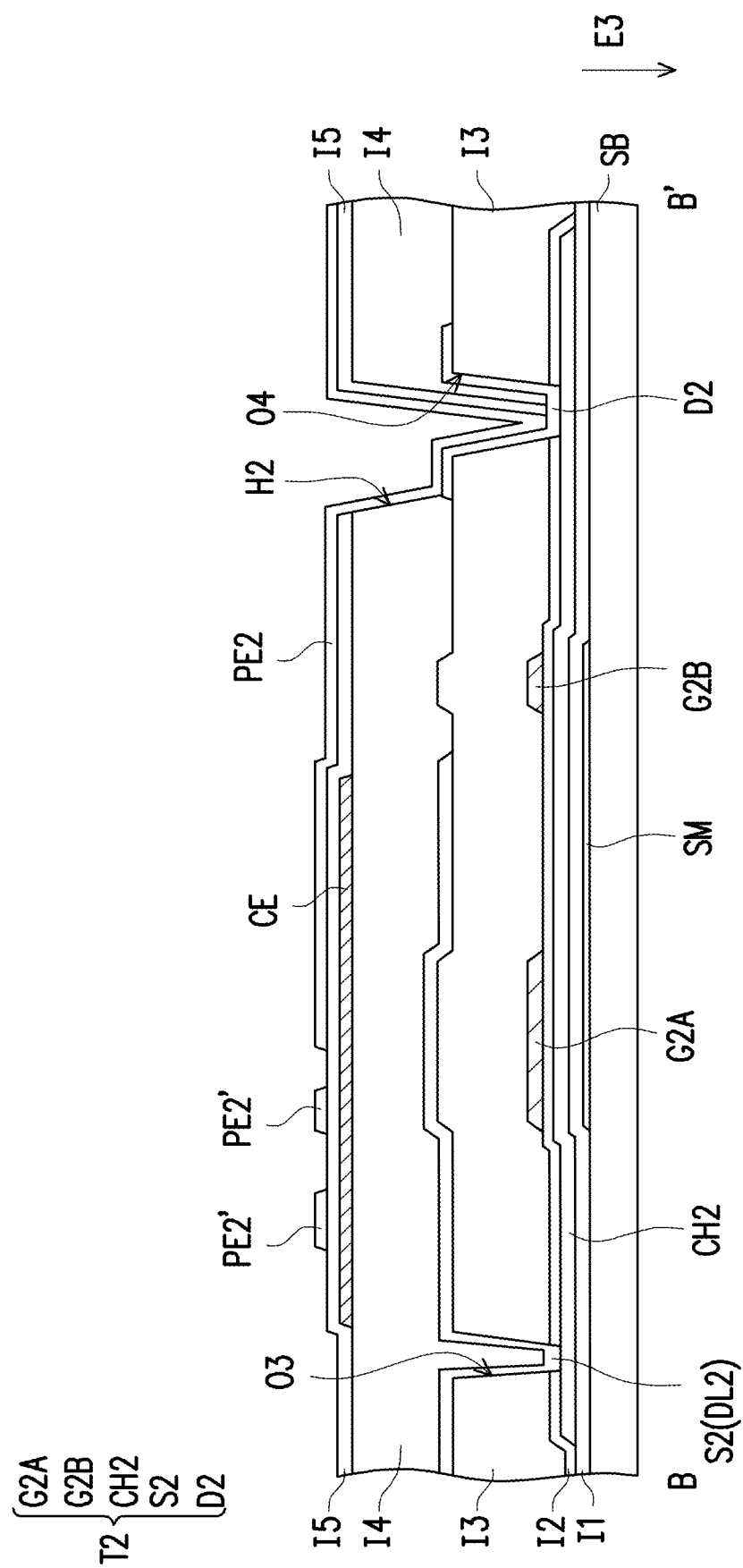
FIG. 4B is a cross-sectional view taken along line BB' in FIG. 3A.

FIG. 3A is a schematic top view of a pixel structure and surrounding elements thereof according to an embodiment of the invention. FIG. 3B is a partially enlarged view of FIG. 3A, wherein FIG. 3B illustrates a common electrode, a first electrode, and a second electrode, and omits other components. FIG. 4A is a cross-sectional view taken along line AA' in FIG. 3A. FIG. 4B is a cross-sectional view taken along line BB' in FIG. 3A, wherein FIG. 3A omits some components in FIG. 4A and FIG. 4B.

Here, it should be noted that the disclosure of FIG. 3A, FIG. 3B, FIG. 4A and FIG. 4B follow the reference numerals and the part of the content of the disclosure of FIG. 1A, FIG. 1B, FIG. 2A and FIG. 2B, wherein the same or similar reference numerals are used to represent the same or similar elements, and descriptions of the same technical content are omitted. Regarding the descriptions of the omitted portions, references may be made to the aforementioned embodiments and the details are not repeated herein.

The main difference between pixel structure 20 of FIG. 3A and pixel structure 10 of FIG. 1A lies in that the shapes of the common electrode CE, the first electrode PE1 and the second electrode PE2 of the pixel structure 20 are different from the shapes of the common electrode CE, the first electrode PE1, and the second electrode PE2 of the pixel structure 10.

Referring to FIG. 3A, FIG. 3B, FIG. 4A, and FIG. 4B, the pixel structure 20 includes scan line SL, first data line DL1, second data line DL2, first switching element T1, second switching element T2, common electrode CE, first electrode PE1 and second electrode PE2.

The common electrode CE includes first body portion and first branch portions. Referring to FIG. 3B, the first body portion 110 extends substantially in the first direction E1. The first branch portion 120 is connected to the first body portion 110. The first branch portion 120 extends substantially in the second direction E2, but the invention is not limited thereto. In some embodiments, the width of the first branch portion 120 gradually decreases along a direction away from the first body portion 110. In some embodiments, the shape of the first branch portion 120 includes, for example, a trapezoid, a triangle, or other geometric shapes.

The first electrode PE1 is electrically connected to the drain D1 of the first switching element T1. The first electrode PE1 includes second body portion and second branch portions. Referring to FIG. 3B, the second body portion 210 extends substantially in the first direction E1. The second branch portion 220 is connected to the second body portion 210. In the present embodiment, the second branch portion 220 extends substantially in the second direction E2, but the invention is not limited thereto. In some embodiments, a width of the second branch portion 220 gradually decreases along a direction away from the second body portion 210. In some exemplary embodiments, the shape of the second branch portion 220 includes, for example, a trapezoid, a triangle, or other geometric shapes.

The first branch portion 120 and the second branch portion 220 are substantially located between the first body portion 110 and the second body portion 120. The first branch portion 120 and the second branch portion 220 are alternately arranged in the first direction E1.

The second data line DL2 and the first body portion 110, for example, extend substantially in the first direction E1.

The second data line DL2 overlaps the first body portion 110 in the projection direction E3, but the invention is not limited thereto. In some exemplary embodiments, the second data line DL2, for example, overlaps the first body portion 110 and the first branch portion 120 in the projection direction E3, but the second data line DL2 does not overlap the second branch portion 220 in the projection direction E3. In some exemplary embodiments, the second data line DL2, for example, overlaps the first body portion 110, the first branch portion 120, and the second branch portion 220 in the projection direction E3. In some exemplary embodiments, a distance between the second data line DL2 and the first data line DL1 is approximately equal to a distance between the second data line DL2 and the first data line DL1', and a distance between the second data line DL2 and the first body portion 110 is approximately equal to a distance between the second data line DL2 and the second body portion 210. In other words, the second data line DL2 does not overlap the first body portion 110 and the second body portion 210 in the projection direction E3, but the second data line DL2 overlaps the first branch portion 120 and the second branch portion 220 in the projection direction E3. In this way, more study of designing small gap between the second data line DL2 and the first data line DL1' may be avoided, and therefore pixel structures 20 can be arranged in a higher concentration way.

In the present embodiment, the common electrode CE and the first electrode PE1 are, for example, formed by a same patterned conductive layer. In other words, the common electrode CE and the first electrode PE1 are formed in the same patterning process, but the invention is not limited thereto.

The second electrode PE2 is electrically connected to the drain D2 of the second switching element T2. In the present embodiment, the second electrode PE2 and the drain D2 belong to different conductive film layers, but the invention is not limited thereto. The second electrode PE2 includes at least two main portions and at least one bridge portion. Referring to FIG. 3B, the main portions 310A and 310B extend substantially in the first direction E1, and the bridge portion 320 is connected to the main portions 310A and 310B. In the present embodiment, the bridge portion 320 overlaps the first branch portion 120 in the projection direction E3. The bridge portion 320 exposes a portion of the first branch portion 120 in the projection direction E3. The bridge portion 320 does not overlap at least one of the second branch portions 220 in the projection direction E3. In the present embodiment, the bridge portion 320 does not overlap the second branch portions 220 in the projection direction E3, but the invention is not limited thereto.

The bridge portion 320 includes the first connecting portion 3222, the second connecting portion 3224, and the third connecting portion 3226 that are sequentially connected. The first connecting portion 3222 is closer to the first body portion 110 than the second connecting portion 3224, and the width of the second connecting portion 3224 gradually decreases along a direction away from the first body portion 110. The first connecting portion 3222 overlaps the first body portion 110 in the projection direction E3, but does not overlap the second body portion 210, the first branch portion 120 and/or the second branch portion 220. The third connecting portion 3226 overlaps the second body portion 210 in the projection direction E3, but does not overlap the first body portion 110 and does not overlap the first branch portion 120 and/or the second branch portion 220, but the invention is not limited thereto.

The extending direction C1 of the first connecting portion 3222 is, for example, different from the extending direction C2 of the second connecting portion 3224. The extending direction C2 of the second connecting portion 3224 is, for example, different from the extending direction C3 of the third connecting portion 3226. When the second electrode PE1 of the pixel structure 20 is used to drive a liquid crystal located thereon, since the extending directions of the first connecting portion 3222 and the third connecting portion 3226 are different from the extending direction of the second connecting portion 3224, an electric field may be more concentrated at a location near the first body portion 110 and/or the second body portion 210, such that the portion with poor liquid crystal efficiency of the liquid crystal layer (not shown) can be restricted at the location near the first body portion 110 and/or the second body portion 210, and no more tautology here.

In the present embodiment, when first voltage is applied to the first electrode PE1 and the first voltage is not applied to the second electrode PE2 and the common electrode CE, a domain size of the pixel structure 20 may be regarded as L1. When second voltage is applied to the second electrode PE2 and the second voltage is not applied to the first electrode PE1 and the common electrode CE, a domain size of the pixel structure 20 may be regarded as L2. Since the bridge portion 320 overlaps the first branch portion 120 in the projection direction E3, L1 is smaller than L2.

In other words, when the first voltage is applied to the first electrode PE1 and the first voltage is not applied to the second electrode PE2 and the common electrode CE, since the domain size L1 is smaller, and the pixel structure 20 has an advantage of shortening the liquid crystal response time of the liquid crystal display panel. When the second voltage is applied to the second electrode PE2, and the second voltage is not applied to the first electrode PE1 and the common electrode CE, the domain size L2 is larger, and the liquid crystal layer may have a higher light transmittance. Therefore, when fast liquid crystal response time is not required, the pixel structure 20 may be operated in a mode for higher light transmittance, so as to save power consumption.

Figure 5:
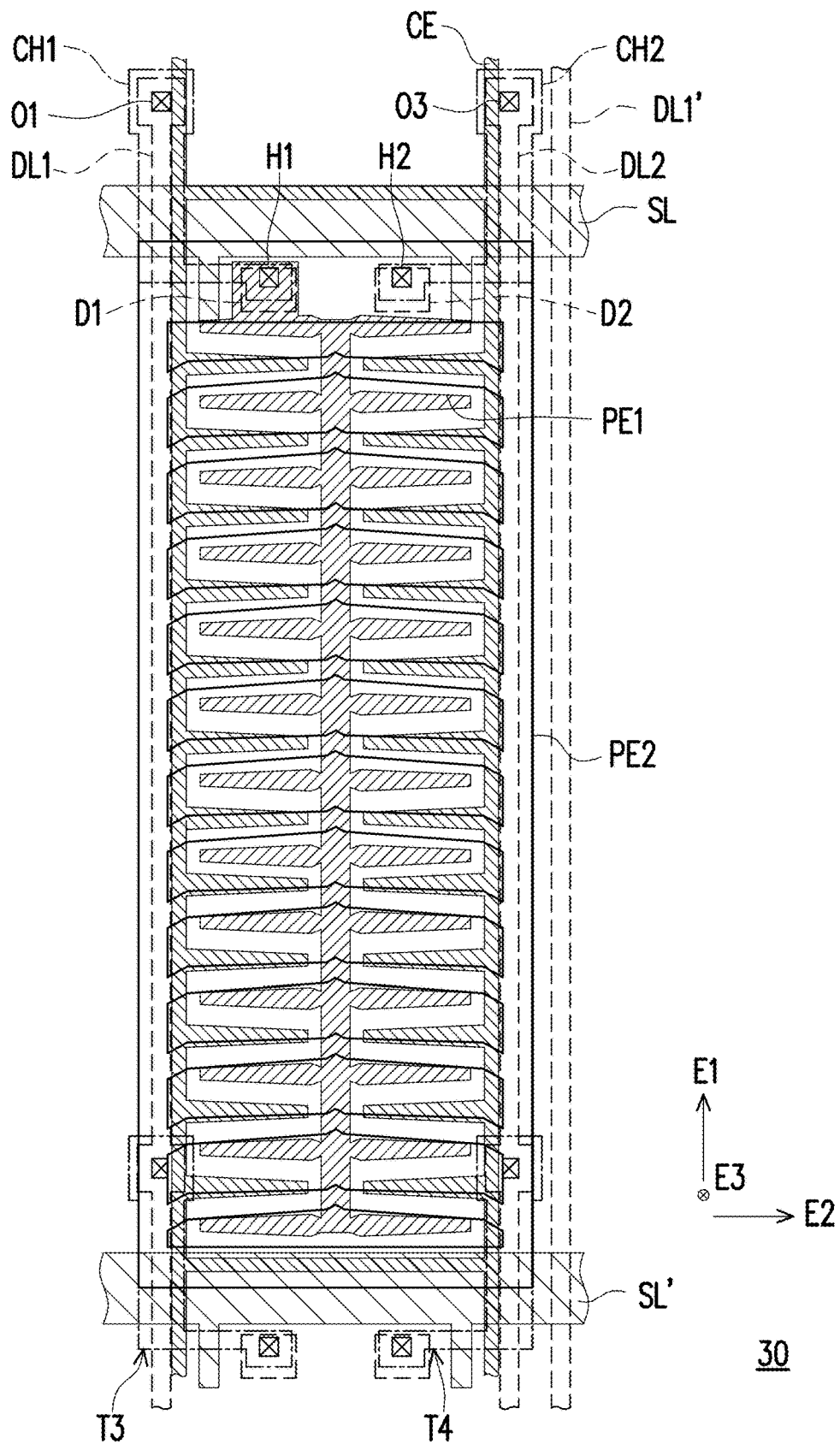
FIG. 5 is a schematic top view of a pixel structure and surrounding elements thereof according to an embodiment of the invention.

FIG. 5 is a schematic top view of a pixel structure and surrounding elements thereof according to an embodiment of the invention.

Here, it should be noted that the embodiment of FIG. 5 follows the reference numerals and part of the content of the disclosure of FIG. 1A, FIG. 1B, FIG. 2A and FIG. 2B, wherein the same or similar reference numerals are used to represent the same or similar elements, and descriptions of the same technical content are omitted. Regarding the descriptions of the omitted portions, references may be made to the aforementioned embodiments and the details are not repeated herein.

The main difference between a pixel structure 30 of FIG. 5 and the pixel structure 10 of FIG. 1A lies in that the second data line DL2 of the pixel structure 30 is disposed at a position different from that of the second data line DL2 of the pixel structure 10. The common electrode CE, the first electrode PE1, and the second electrode PE2 of FIG. 5 are similar to those of FIG. 1B.

Referring to FIG. 5 and FIG. 1B, the pixel structure 30 includes scan line SL, first data line DL1, second data line DL2, first switching element T1, second switching element T2, common electrode CE, first electrode PE1, and second electrode PE2. The first data line DL1 and the second data line DL2 extend substantially in a first direction E1. The first switching element T1 is electrically connected to the scan line SL and the first data line DL1. The second switching element T2 and the second data line DL2 are electrically connected. The common electrode CE includes the first body portions 110A and 110B and the first branch portions 120A and 120B. The first body portions 110A and 110B extend substantially in the first direction E1. The first branch portions 120A and 120B are respectively connected to the corresponding first body portions 110A and 110B. The first electrode PE1 is electrically connected to the first switching element T1. The first electrode PE1 includes a second body portion 210 and second branch portions 220A and 220B. The second body portion 210 is located between the first body portions 110A and 110B, and extends substantially in the first direction E1. The second branch portions 220A and 220B are correspondingly electrically connected to two opposite sides of the second body portion 210 and extend outwards. The second electrode PE2 is electrically connected to the second switching element T2. The second electrode PE2 includes main portions 310A and 310B and bridge portion 320. The main portions 310A and 310B extend substantially in the first direction E1. The bridge portion 320 is electrically connected to the main portions 310A and 310B. The bridge portion 320 overlaps at least one of the first branch portions 120A and 120B in the projection direction E3. The bridge portion 320 does not overlap at least one of the second branch portions 220A and 220B in the projection direction E3.

In the embodiment, the second data line DL2 of the pixel structure 30 is disposed adjacent to the first data line DL1', wherein the first data line DL1' is, for example, a data line belonging to other pixel structure adjacent to the pixel structure 30. The second data line DL2, for example, overlaps the first body portion 110B of the common electrode CE and/or the main portion 310B of the second electrode PE2. In the present embodiment, the second data line DL2 does not overlap the first electrode PE1, the first body portion 110A and the first branch portion 120A in the projection direction E3, but may selectively overlaps the first body portion 110B and/or the first branch portion 120B.

In the present embodiment, when first voltage is applied to the first electrode PE1 and the first voltage is not applied to the second electrode PE2 and the common electrode CE, a domain size of the pixel structure 30 may be regarded as L1. When second voltage is applied to the second electrode PE2 and the second voltage is not applied to the first electrode PE1 and the common electrode CE, a domain size of the pixel structure 30 may be regarded as L2. Since the bridge portion 320 and the first branch portions 120A and 120B overlap in the projection direction E3, L1 is smaller than L2.

In other words, when the first voltage is applied to the first electrode PE1 and the first voltage is not applied to the second electrode PE2 and the common electrode CE, since the domain size L1 is smaller, and the pixel structure 30 has an advantage of shortening the liquid crystal response time of the liquid crystal display panel. When the second voltage is applied to the second electrode PE2 and the second voltage is not applied to the first electrode PE1 and the common electrode CE, the domain size L2 is larger, and the liquid crystal layer may have higher light transmittance. Therefore, when fast liquid crystal response time is not required, the pixel structure 30 may be operated in a mode for higher light transmittance, so as to save power consumption.

Figure 6:
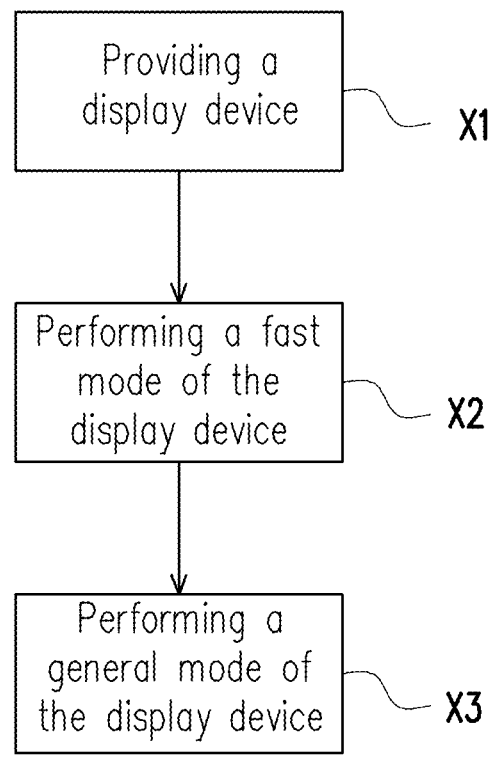
FIG. 6 is a flowchart of a driving method capable of switching display modes according to an embodiment of the invention.

FIG. 6 is a flowchart of a driving method capable of switching display modes according to an embodiment of the invention.

Here, it should be noted that the embodiment of FIG. 6 follows the reference numbers and part of the content of the aforementioned embodiments, wherein the same or similar reference numerals are used to represent the same or similar elements, and descriptions of the same technical content are omitted. Regarding the descriptions of the omitted portions, references may be made to the aforementioned embodiments and the details are not repeated herein.

Referring to FIG. 6, a driving method capable of switching display modes includes step X1, step X2 and step X3.

Step X1 includes providing a display device, wherein the display device includes at least a pixel structure of any one of the aforementioned embodiments.

Step X2 includes performing a fast mode. The step of performing the fast mode includes: applying a first voltage to the first electrode PE1 of the pixel structure, and not applying the first voltage to the second electrode PE2 and the common electrode CE of the pixel structure. In some embodiments, the step of performing the fast mode further includes applying a third voltage to the second electrode PE2 and the common electrode CE of the pixel structure.

In some embodiments, when performing the fast mode, the first voltage is greater than 0 volts and smaller than 7 volts, and the third voltage is 0 volts. In some embodiments, when performing the fast mode, no voltage is applied to the second electrode PE2 and the common electrode CE of the pixel structure. The voltage on each of the first electrode PE1 and the common electrode CE of the pixel structure is, for example, 0 volts.

Step X3 includes performing a general mode. The step of performing the general mode includes: applying a second voltage to the second electrode PE2 of the pixel structure, and not applying the second voltage to the first electrode PE1 and the common electrode CE of the pixel structure. In some embodiments, the step of performing the general mode further includes applying a third voltage to the first electrode PE1 and the common electrode CE of the pixel structure.

In some embodiments, when the general mode is performed, the second voltage is 0 volts, and the third voltage is greater than 0 volts and smaller than 7 volts. In some embodiments, when performing the general mode, no voltage is applied to the first electrode PE1 and the common electrode CE of the pixel structure, and the voltage on the first electrode PE1 and the common electrode CE in the pixel structure is, for example, 0 volts.

In the embodiment, the fast mode of the display device may be first performed, and then followed by switching the display device to the general mode, but the invention is not limited thereto. In other exemplary embodiments, the general mode is first performed, and then followed by switching the display device to the fast mode. In other words, the invention does not limit the chronological order of the fast mode and the general mode.

In the embodiment, when the first voltage is applied to the first electrode PE1 and the first voltage is not applied to the second electrode PE2 and the common electrode CE, the pixel structure has the advantage of shortening the liquid crystal response time of the liquid crystal display panel. In other words, when performing the fast mode, the display device may have a higher frame per second (FPS), and smoother and continuous images can be displayed. In general, FPS is used to describe how many frames per second are played in a movie, an electronic drawing, or a game.

In the present embodiment, when the second voltage is applied to the second electrode PE2 and the second voltage is not applied to the first electrode PE1 and the common electrode CE, the greater the vertical distance between two dark areas, the higher the light transmittance of the liquid crystal layer. In other words, when performing the general mode of the display device, the display device can display sufficient brightness without requiring very high power consumption.

Based on the foregoing, the power consumption of the display device in the general mode is lower than the power consumption of the display device in the fast mode. Therefore, the operation mode for high transmittance may be performed under the situation when fast liquid crystal response time is not required so as to save power consumption. On the other hand, when a short liquid crystal response time is required, the display device may be switched to the fast mode, thereby increasing the frames per second.

Figure 7B:
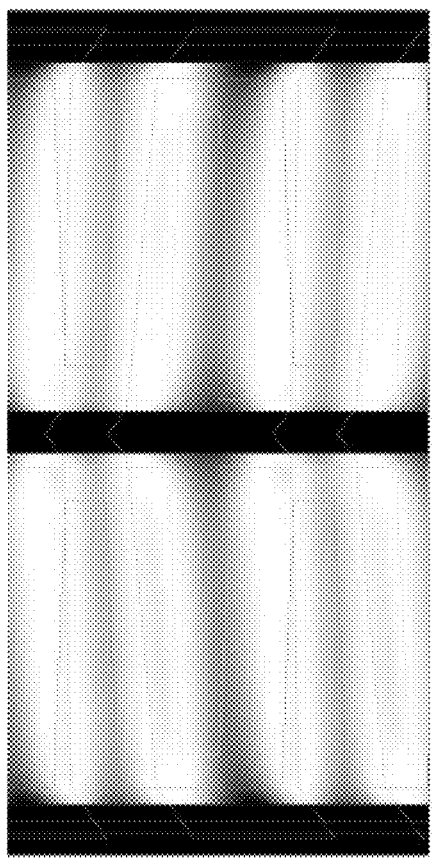
FIG. 7B is a simulation of a partially dark area of a pixel structure in a general mode according to an embodiment of the invention.
Figure 7A:
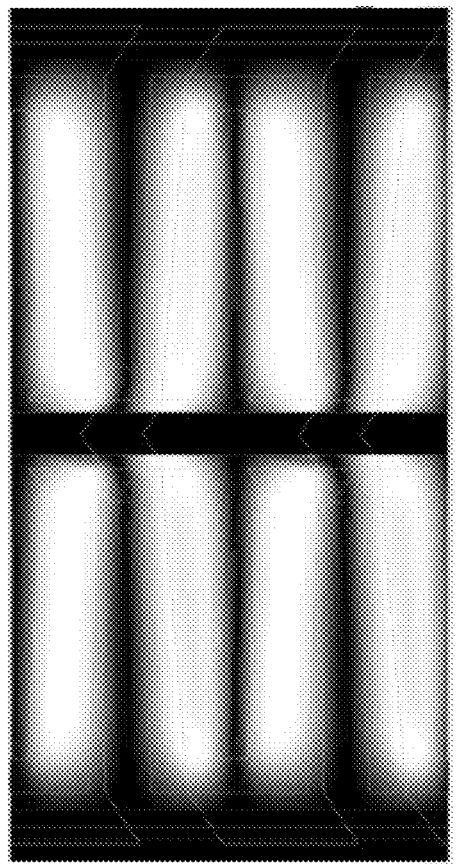
FIG. 7A is a simulation of a partially dark area of a pixel structure in a fast mode according to an embodiment of the invention.

FIG. 7A is a simulation of a partially dark area of a pixel structure in a fast mode according to an embodiment of the invention. FIG. 7B is a simulation of a partially dark area of a pixel structure in a general mode according to an embodiment of the invention. The pixel structure of FIG. 7A and FIG. 7B is, for example, similar to the pixel structure of FIG. 1A.

Referring to FIG. 7A and FIG. 7B together, when performing the fast mode or the general mode of the display device, a dark area will appear at locations corresponding to the first branch portions and the second branch portions of the pixel structure.

Referring to FIG. 7A, when performing the fast mode, a width of the dark area is larger, that is, a domain size of the pixel structure is smaller. Since the domain size is smaller, the pixel structure has an advantage of shortening the liquid crystal response time of the liquid crystal display panel.

Referring to FIG. 7B, when performing the general mode, a width of the dark area is smaller, that is, a domain size of the pixel structure is larger. The liquid crystal layer has a higher light transmittance.

Therefore, the general mode for high transmittance may be performed under the situation when fast liquid crystal response time is not required so as to save power consumption.

Figure 8B:
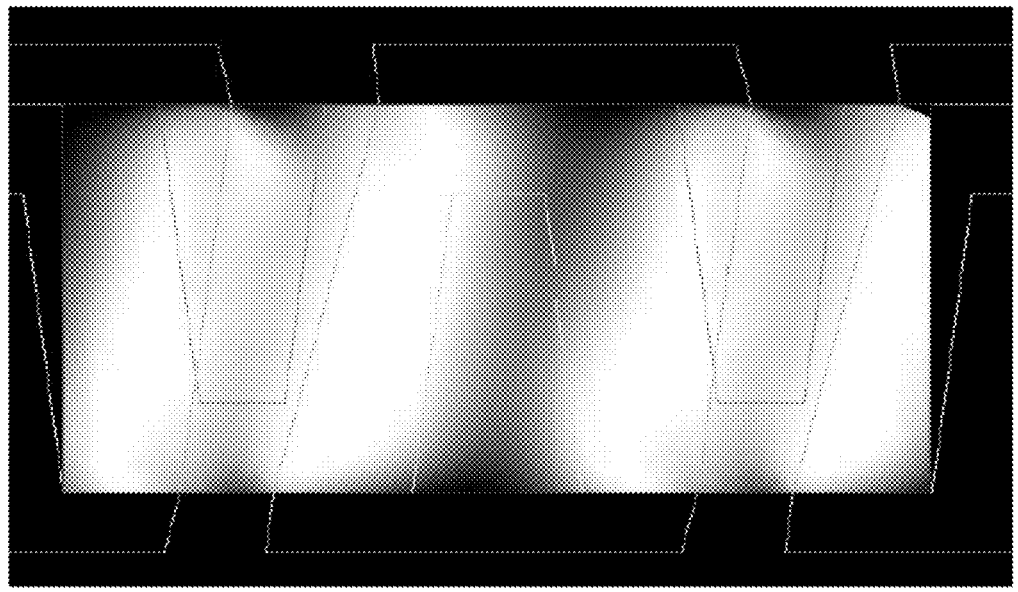
FIG. 8B is a simulation of a partially dark area of a pixel structure in a general mode according to an embodiment of the invention.
Figure 8A:
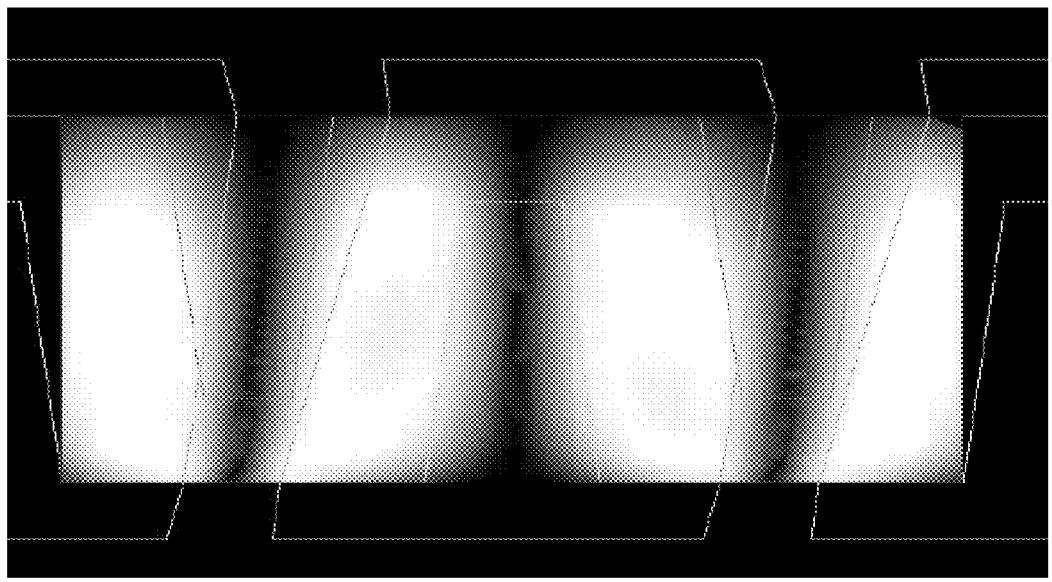
FIG. 8A is a simulation of a partially dark area of a pixel structure in a fast mode according to an embodiment of the invention.

FIG. 8A is a simulation of a partially dark area of a pixel structure in a fast mode according to an embodiment of the invention. FIG. 8B is a simulation of a partially dark area of a pixel structure in a general mode according to an embodiment of the invention. The pixel structure of FIG. 8A and FIG. 8B is, for example, similar to the pixel structure of FIG. 3A.

Referring to FIG. 8A and FIG. 8B together, when performing the fast mode or the general mode of the display device, a dark area may appear in locations corresponding to the first branch portions and the second branch portions of the pixel structure.

Referring to FIG. 8A, when performing the fast mode, a width of the dark area is larger, that is, the domain size of the pixel structure is smaller. Since the domain size is smaller, the pixel structure has an advantage of shortening the liquid crystal response time of the liquid crystal display panel.

Referring to FIG. 8B, when performing the general mode, a width of the dark area is smaller, that is, the domain size of the pixel structure is larger. The liquid crystal layer may have a higher light transmittance.

Therefore, the general mode for high transmittance may be performed under the situation when fast liquid crystal response time is not required so as to save power consumption.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A pixel structure, comprising:
   a scan line, a first data line and a second data line, wherein the first data line and the second data line substantially extend in a first direction;
   a first switching element, electrically connected with the scan line and the first data line;
   a second switching element, electrically connected with the second data line;
   a common electrode, comprising:
      a first body portion, substantially extending in the first direction; and
      a plurality of first branch portions, connected to the first body portion;
   a first electrode, electrically connected to the first switching element, the first electrode comprising:
      a second body portion; and
      a plurality of second branch portions, connected to the second body portion, wherein the first branch portions and the second branch portions are substantially located between the first body portion and the second body portion, and the first branch portions and the second branch portions are alternately arranged in the first direction; and
   a second electrode, electrically connected to the second switching element, the second electrode comprising:
      a plurality of main portions, substantially extending in the first direction; and
      at least one bridge portion, connected to the main portions, wherein the at least one bridge portion and at least one of the first branch portions overlap in a projection direction.

2. The pixel structure according to claim 1, wherein the at least one bridge portion exposes a portion of the first branch portions in the projection direction.

3. The pixel structure according to claim 1, wherein the common electrode and the first electrode are formed by a same patterned conductive layer.

4. The pixel structure according to claim 1, wherein a shape of each of the first branch portions comprises a trapezoid, and a width of each of the first branch portions gradually decreases along a direction away from the first body portion.

5. The pixel structure according to claim 1, wherein the at least one bridge portion comprises a first connecting portion and a second connecting portion sequentially connected, wherein the first connecting portion is closer to the first body portion than the second connecting portion, and a width of the second connecting portion gradually decreases along a direction away from the first body portion.

6. The pixel structure according to claim 5, wherein an extending direction of the first connecting portion is different from an extending direction of the second connecting portion.

7. The pixel structure according to claim 1, wherein the at least one bridge portion and the second branch portions do not overlap in the projection direction.

8. A driving method capable of switching display modes, comprising:
   providing a display device, the display device comprises at least one pixel structure according to claim 1;
   performing a fast mode, comprising: applying a first voltage to the at least one first electrode, and not applying the first voltage to the at least one second electrode and the common electrode; and performing a general mode, comprising: applying a second voltage to the at least one second electrode, and not applying the second voltage to the at least one first electrode and the common electrode.

* * * * *